US008355909B2

(12) United States Patent
Carroll et al.

(10) Patent No.: US 8,355,909 B2
(45) Date of Patent: Jan. 15, 2013

(54) HYBRID PERMANENT/REVERSIBLE DYNAMIC RANGE CONTROL SYSTEM

(75) Inventors: Timothy J Carroll, Lancaster, PA (US); Leif Claesson, Lancaster, PA (US)

(73) Assignee: Audyne, Inc., Lancaster, PA (US)

( * ) Notice: Subject to any disclaimer, the term of this patent is extended or adjusted under 35 U.S.C. 154(b) by 0 days.

(21) Appl. No.: 13/494,211

(22) Filed: Jun. 12, 2012

(65) Prior Publication Data

US 2012/0250893 A1 Oct. 4, 2012

Related U.S. Application Data

(63) Continuation of application No. 12/775,319, filed on May 6, 2010.

(60) Provisional application No. 61/175,853, filed on May 6, 2009.

(51) Int. Cl.
*G10L 19/14* (2006.01)
*G10L 11/00* (2006.01)
*G10L 19/00* (2006.01)

(52) U.S. Cl. .................. 704/225; 704/201; 704/200

(58) Field of Classification Search ............ 704/200, 704/200.1, 201, 225; 348/462, 736, 738; 381/104, 107
See application file for complete search history.

(56) References Cited

U.S. PATENT DOCUMENTS

| 5,583,962 | A | 12/1996 | Davis et al. |
|---|---|---|---|
| 5,633,981 | A | 5/1997 | Davis |
| 6,215,429 | B1 | 4/2001 | Fischer et al. |
| 6,311,155 | B1 | 10/2001 | Vaudrey et al. |
| 6,807,528 | B1 | 10/2004 | Truman et al. |
| 7,359,853 | B2 * | 4/2008 | Holmes ................. 704/201 |
| 7,398,207 | B2 | 7/2008 | Riedl |
| 7,617,109 | B2 | 11/2009 | Smithers et al. |
| 7,738,487 | B2 | 6/2010 | El-Maleh et al. |
| 2004/0044525 | A1 * | 3/2004 | Vinton et al. |
| 2005/0232445 | A1 * | 10/2005 | Vaudrey et al. ............. 381/109 |
| 2009/0074209 | A1 | 3/2009 | Thompson et al. |
| 2010/0286988 | A1 | 11/2010 | Carroll et al. |

OTHER PUBLICATIONS

Office Action of U.S. Appl. No. 12/755,319, dated Mar. 16, 2012.
SMPTE Registered Disclosure Document RDD Jun. 2008; "Description and Guide to the Use of the Dolby E Audio Metadata Serial Bitstream"; The Society of Motion Picture & Television.
International Standard ISO/IEC 14496-3; "Information technology—Coding of audio-visual objects—Part 3: Audio"; ISO/IEC 2001.
Advanced Television Systems Committee, Inc.; "ATSC Digital Television Standard: Part 5—AC-3 Audio System Characteristics"; Document A/53 Part 5:2010, Jul. 6, 2010.

(Continued)

*Primary Examiner* — Jesse Pullias
(74) *Attorney, Agent, or Firm* — Renner, Otto, Boisselle & Sklar LLP

(57) ABSTRACT

A system for controlling dynamic range of an audio signal comprises an automatic gain control element that receives an input signal having a varying level and outputs a control signal that varies based on the varying level of the input signal and a modified input signal having a dynamic range different than a dynamic range of the input signal. The system also comprises an inverter that inverts the control signal or a block-based control signal corresponding to the control signal in block format. The system also comprises a variable gain element that receives the modified input signal and at least some of the inverted control signal or block-based control signal. The variable gain element also outputs a remainder signal corresponding to the modified input signal as unmodified based on the at least some of the inverted control signal or block-based control signal.

20 Claims, 8 Drawing Sheets

OTHER PUBLICATIONS

Advanced Television Systems Committee, Inc.; "Digital Audio Compression Standard (AC-3, E-AC-3) Revision B"; Document A/52B, Jun. 14, 2005.

Davis, Mark E.; "The AC-3 Multichannel Coder"; presented at the 95th AES Convention, Oct. 7-10, 1993.

* cited by examiner

PRIOR ART

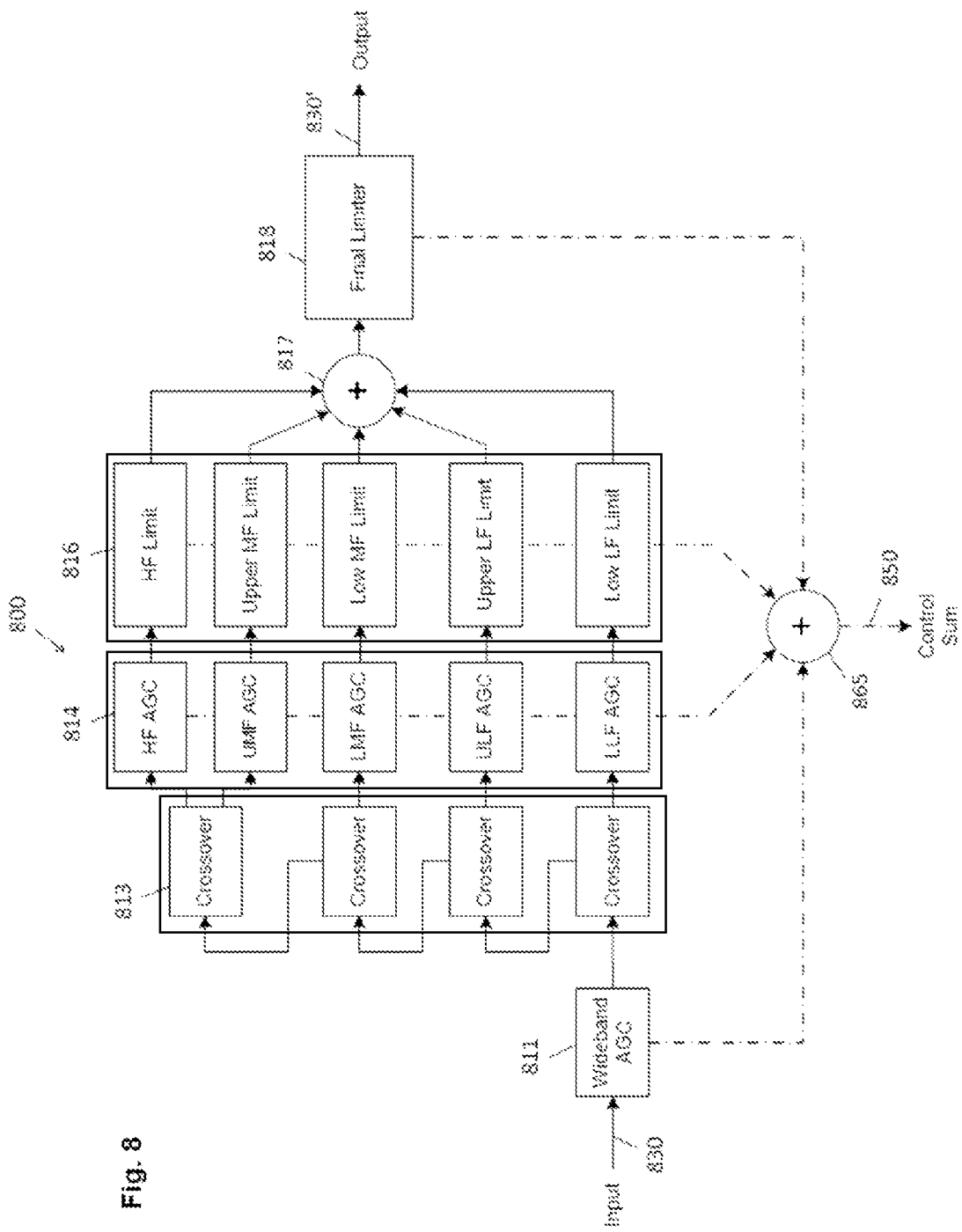

HYBRID PERMANENT/REVERSIBLE DYNAMIC RANGE CONTROL SYSTEM

CROSS REFERENCE TO RELATED APPLICATIONS

This application is a continuation of U.S. patent application Ser. No. 12/775,319, filed May 6, 2010, which claims priority to U.S. Provisional Application No. 61/175,853, filed May 6, 2009, the disclosures of which are incorporated by reference herein in their entirety.

BACKGROUND

Modern distribution of audio signals to consumers necessarily involves the use of data rate reduction or compression techniques to lower the required amount of data required to deliver these audio signals to consumers while causing minimal impact to the original audio quality. Systems including AC-3, DTS, MPEG-2 AAC and HE AAC are examples of common audio coding systems that use data reduction techniques. For the purposes of this invention, only the AC-3 system will be used as an example, but the invention is applicable to any coding system and is applicable to television, radio, internet, or any other means of program distribution or transmission.

Audio metadata, also known as data about the audio data, is also included with these systems to describe the encoded audio. This data is multiplexed in with the compressed or coded audio data and delivered to consumers where it is extracted and applied to the audio in a user-adjustable manner. One such metadata parameter is called dialnorm and is intended to indicate the average loudness of a program. Other parameters such as dynrng and compr, collectively referred to as Dynamic Range Control or DRC, are intended to control the variation between the quietest and loudest parts of an audio signal.

Programs are in many cases produced with loudness and dynamic range that varies to convey emotion or the level of excitement in a given scene, while interstitial or commercial material is very often produced to convey a message and may be at a constant loudness. In some cases these program and commercial elements can differ substantially in average loudness and dynamic range and many consumer environments are not conducive to these large variations in loudness or dynamic range. Artistic intent while perhaps appropriate in more carefully controlled situations can cause audibility problems and result in viewer or listener complaints. This is commonly referred to as the "loud commercial problem" but can be caused as much by excessive dynamic range as mismatched loudness.

An additional complicating factor is the desire and sometimes the legal requirement for maintaining the integrity of the original audio as some viewers and even regulatory bodies may require that the program audio not be changed in any way. Because of this, processes applied to the audio should ideally be reversible.

Prior art has described two general types of systems capable of controlling audio dynamic range: AGC-type systems that detect and adjust the level of applied audio signals in a permanent and non-reversible manner, and systems that use side-chain data or metadata to allow the original audio to be carried to consumers and be modified using the metadata.

SUMMARY OF THE INVENTION

This present disclosure describes systems and methods for controlling audio dynamic range in a hybrid manner that can be permanent, reversible, or anywhere in between, and can accomplish this goal in the baseband PCM or coded domains.

According to one aspect of the invention, a system for controlling dynamic range of an audio signal comprises an automatic gain control element configured to receive an input signal having a varying level. The automatic gain control element is also configured to output a control signal that varies based on the varying level of the input signal and a modified input signal having a dynamic range different than a dynamic range of the input signal. In one embodiment, the control signal takes the form of one or more metadata parameters such as dialnorm or dynrng or compr, also known as DRC. In one embodiment, the system for controlling dynamic range of an audio signal then block formats this control signal to produce a result that matches the capabilities of a subsequent audio encoder. The system for controlling dynamic range of an audio signal also comprises an inverter in circuit with the automatic gain control element and configured to receive and invert at least one of the control signal or a block-based control signal corresponding to the control signal in block format. The system for controlling dynamic range of an audio signal also comprises a variable gain element configured to receive the modified input signal and at least some of the inverted at least one of the control signal or the block-based control signal, and further configured to output a remainder signal corresponding to the modified input signal as unmodified based on the at least some of the inverted at least one of the control signal or the block-based control signal.

In one embodiment, the system for controlling dynamic range of an audio signal comprises a block formatter in circuit with the automatic gain control element and the inverter, and configured to receive the control signal and to output the block-based control signal corresponding to the control signal in block format.

In another embodiment, the system for controlling dynamic range of an audio signal comprises a control element in circuit with the inverter and the variable gain element, and configured to scale the inverted at least one of the control signal or the block-based control signal to affect the unmodifying of the modified input signal by the variable gain element to produce the remainder signal.

In yet another embodiment, the system for controlling dynamic range of an audio signal comprises a delay element configured to introduce delay to the at least one of the control signal or the block-based control signal to output a metadata signal, and an encoder configured to receive the remainder signal and the metadata signal, and further configured to output an encoded remainder signal encoding the remainder signal and the metadata signal.

In one embodiment, the system for controlling dynamic range of an audio signal comprises a delay element configured to introduce delay to the at least one of the control signal or the block-based control signal to output a delayed control signal, an encoder configured to receive the remainder signal and to output an encoded remainder signal, and a multiplexer configured to receive the delayed control signal and the encoded remainder signal, and further configured to output an encoded bit stream including the encoded remainder signal and the delayed control signal.

In another embodiment, the system for controlling dynamic range of an audio signal comprises a block formatter in circuit with the automatic gain control element and the inverter, and configured to receive the control signal and to output the block-based control signal corresponding to the control signal in block format, a control element in circuit with the inverter and the variable gain element, and configured to scale the inverted block-based control signal to affect the unmodifying of the modified input signal by the variable gain element to produce the remainder signal, a delay element configured to introduce delay to the block-based control signal to output a metadata signal, and an encoder configured to receive the remainder signal and the metadata signal, and further configured to output an encoded remainder signal encoding the remainder signal and the metadata signal.

In yet another embodiment, the system for controlling dynamic range of an audio signal comprises a block formatter in circuit with the automatic gain control element and the inverter, and configured to receive the control signal and to output the block-based control signal corresponding to the control signal in block format, a control element in circuit with the inverter and the variable gain element, and configured to scale the inverted block-based control signal to affect the unmodifying of the modified input signal by the variable gain element to produce the remainder signal, a delay element configured to introduce delay to the block-based control signal to output a delayed control signal, an encoder configured to receive the remainder signal and to output an encoded remainder signal, and a multiplexer configured to receive the delayed control signal and the encoded remainder signal, and further configured to output an encoded bit stream including the encoded remainder signal and the delayed control signal.

In one embodiment, the system for controlling dynamic range of an audio signal comprises a decoder configured to receive an encoded input signal and to decode the encoded input signal into the input signal.

In another embodiment, the system for controlling dynamic range of an audio signal comprises a second delay element configured to receive the encoded input signal, to introduce delay to the encoded input signal, and to output a delayed encoded input signal, wherein the multiplexer is configured to receive the delayed control signal, the encoded remainder signal and the delayed encoded input signal, and further configured to output an encoded bit stream including the delayed control signal, the encoded remainder signal and the delayed encoded input signal.

In one embodiment, the automatic gain control element comprises a multiplexer configured to receive and multiplex the input signal and the control signal into a composite data stream, a demultiplexer configured to receive and demultiplex the composite data stream into the input signal and the control signal, a second variable gain element configured to receive the input signal and at least some of the control signal, and further configured to output the modified input signal corresponding to the input signal as modified based on the at least some of the control signal, and a control element configured to scale the control signal to provide the at least some of the control signal to the second variable gain element to control modification of the input signal into the modified input signal.

In another embodiment, the automatic gain control element comprises a level detector configured to receive the input signal and to output the control signal that varies based on the varying level of the input signal.

In yet another embodiment, the automatic gain control element comprises a wideband automatic gain control (WBAGC) element configured to receive the input signal and to output an averaged level adjusted input signal and a WBAGC control signal, a plurality of crossovers, each crossover associated with a respective frequency band and configured to receive the averaged level adjusted input signal, the plurality of crossovers configured to split the averaged level adjusted input signal into respective frequency band specific input signals, a plurality of frequency band specific automatic gain control (FBSAGC) elements, each FBSAGC element associated with a respective frequency band, the plurality of FBSAGC elements configured to receive the frequency band specific input signals and to output respective dynamic range modified frequency band specific input signals and an FBSAGC control signal, a plurality of frequency band specific limiters (FBSL), each FBSL associated with a respective frequency band, the plurality of FBSL configured to receive the dynamic range modified frequency band specific input signals and to output respective limited dynamic range modified frequency band specific input signals and an FBSL control signal, a first summer configured to receive the limited dynamic range modified frequency band specific input signals and to output a summed signal, a final limiter configured to receive the summed signal and to output the modified input signal and a final limiter control signal, and a second summer configured to receive the WBAGC control signal, the FBSAGC control signal, the FBSL control signal and the final limiter control signal and to output the control signal.

According to another aspect of the invention, a system for controlling dynamic range of an audio signal comprises a decoder configured to receive an encoded input signal and to decode the encoded input signal into an input signal having a varying level, an automatic gain control element configured to receive the input signal and to output a control signal that varies based on the varying level of the input signal, a delay element configured to receive the encoded input signal, introduce delay to the encoded input signal, and to output a delayed encoded input signal, and a multiplexer configured to receive the delayed encoded input signal and at least one of the control signal or a block-based control signal corresponding to the control signal in block format, and further configured to multiplex the delayed encoded input signal and the at least one of the control signal or the block-based control signal to output an encoded bit stream including the delayed encoded input signal and the at least one of the control signal or the block-based control signal.

According to yet another aspect of the invention, a method for controlling dynamic range of an audio signal comprises receiving an input signal having a varying level, modifying the input signal to output a modified input signal having a dynamic range different than a dynamic range of the input signal and a control signal that varies based on the varying level of the input signal, inverting at least one of the control signal or a block-based control signal corresponding to the control signal in block format, unmodifying the modified input signal based on at least some of the inverted at least one of the control signal or the block-based control signal, and outputting a remainder signal corresponding to the modified input signal as unmodified.

In one embodiment, the method for controlling dynamic range of an audio signal comprises block formatting the control signal to output the block-based control signal corresponding to the control signal in block format.

In another embodiment, the method for controlling dynamic range of an audio signal comprises scaling the inverted at least one of the control signal or the block-based control signal to affect the unmodifying of the modified input signal.

In yet another embodiment, the method for controlling dynamic range of an audio signal comprises delaying the at least one of the control signal or the block-based control signal, outputting a metadata signal corresponding to the delayed at least one of the control signal or the block-based control signal, and encoding the remainder signal and the metadata signal.

In one embodiment, the method for controlling dynamic range of an audio signal comprises delaying the at least one of the control signal or the block-based control, encoding the remainder signal, and multiplexing the delayed at least one of the control signal or the block-based control and the encoded remainder signal.

In another embodiment, the method for controlling dynamic range of an audio signal comprises block formatting the control signal to output the block-based control signal corresponding to the control signal in block format, scaling the inverted block-based control signal to affect the unmodifying of the modified input signal, delaying the block-based control signal to output a metadata signal, and encoding the remainder signal and the metadata signal.

In yet another embodiment, the method for controlling dynamic range of an audio signal comprises block formatting the control signal to output the block-based control signal corresponding to the control signal in block format, scaling the inverted block-based control signal to affect the unmodifying of the modified input signal, delaying the block-based control signal to output a delayed control signal, encoding the remainder signal to output an encoded remainder signal, and multiplexing the delayed control signal and the encoded remainder signal.

In one embodiment, the method for controlling dynamic range of an audio signal comprises decoding an encoded input signal into the input signal.

In another embodiment, the method for controlling dynamic range of an audio signal comprises delaying the encoded input signal to output a delayed encoded input signal, wherein multiplexing includes multiplexing the delayed control signal, the encoded remainder signal and the delayed encoded input signal.

In one embodiment, the modifying of the input signal comprises level detecting the input signal to output the control signal, multiplexing the input signal and the control signal into a composite data stream, demultiplexing the composite data stream into the input signal and the control signal, and modifying the input signal based on at least some of the control signal.

In another embodiment, the modifying the input signal comprises average level detecting the input signal to output a wide band adjusted control signal, modifying the input signal into an averaged level adjusted input signal based on the wide band adjusted control signal, splitting the averaged level adjusted input signal into frequency band specific input signals, level detecting the frequency band specific input signals to output a respective frequency band specific control signal, modifying each of the frequency band specific input signals into dynamic range modified frequency band specific input signals based on the respective frequency band specific control signal, limiting the dynamic range modified frequency band specific input signals to output respective limited dynamic range modified frequency band specific input signals and a frequency band specific limited control signal, summing the limited dynamic range modified frequency band specific input signals to output a summed signal, limiting the summed signal to output the modified input signal and a final limiter control signal, and summing the wide band adjusted control signal, the frequency band specific control signal, the frequency band specific limited control signal and the final limiter control signal to output the control signal.

According to yet another aspect of the invention, a method for controlling dynamic range of an audio signal comprises decoding an encoded input signal into an input signal having a varying level, level detecting the input signal to output a control signal that varies based on the varying level of the input signal, delaying the encoded input signal to output a delayed encoded input signal, and multiplexing the delayed encoded input signal and at least one of the control signal and a block-based control signal corresponding to the control signal in block format.

BRIEF DESCRIPTION OF THE DRAWINGS

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

FIG. 8 illustrates a block diagram of an example multiband AGC system.

DETAILED DESCRIPTION

Dynamic range of an applied audio signal can be directly and permanently adjusted by detecting the level of the audio signal and generating a control signal that is used to adjust the gain of the audio higher if it is lower than some reference or to adjust the gain of the audio signal lower if it is higher than some reference, a process commonly known as Automatic Gain Control (AGC).

Dynamic range of an applied audio signal can also be adjusted by detecting the level of the audio signal and generating a control signal that is passed as metadata along with the original audio to some receiving or decoding device where the control signal can be applied directly to adjust the gain of the audio higher if it is lower than some reference or to adjust the gain of the audio signal lower if it is higher than some reference. This control signal can also be scaled before application to produce less or more control of the audio signal, or the control signal can be ignored thus resulting in no change to the original audio. One use of this process is described in ATSC Standard A/52: Digital Audio Compression (AC-3).

The present disclosure describes systems and methods that are fundamentally different from prior work in that these systems and methods represent hybrids between permanent change to applied audio and change that is reversible. Some of the disclosed systems and methods allow for selection of any combination of the two approaches thus providing a minimum and maximum dynamic range on a continuously adjustable basis. Some of the disclosed systems and methods represent techniques for controlling audio dynamic range in a manner that can be permanent, reversible, or anywhere in between, and that can accomplish this goal in the baseband PCM or encoded domains.

Figure 1:
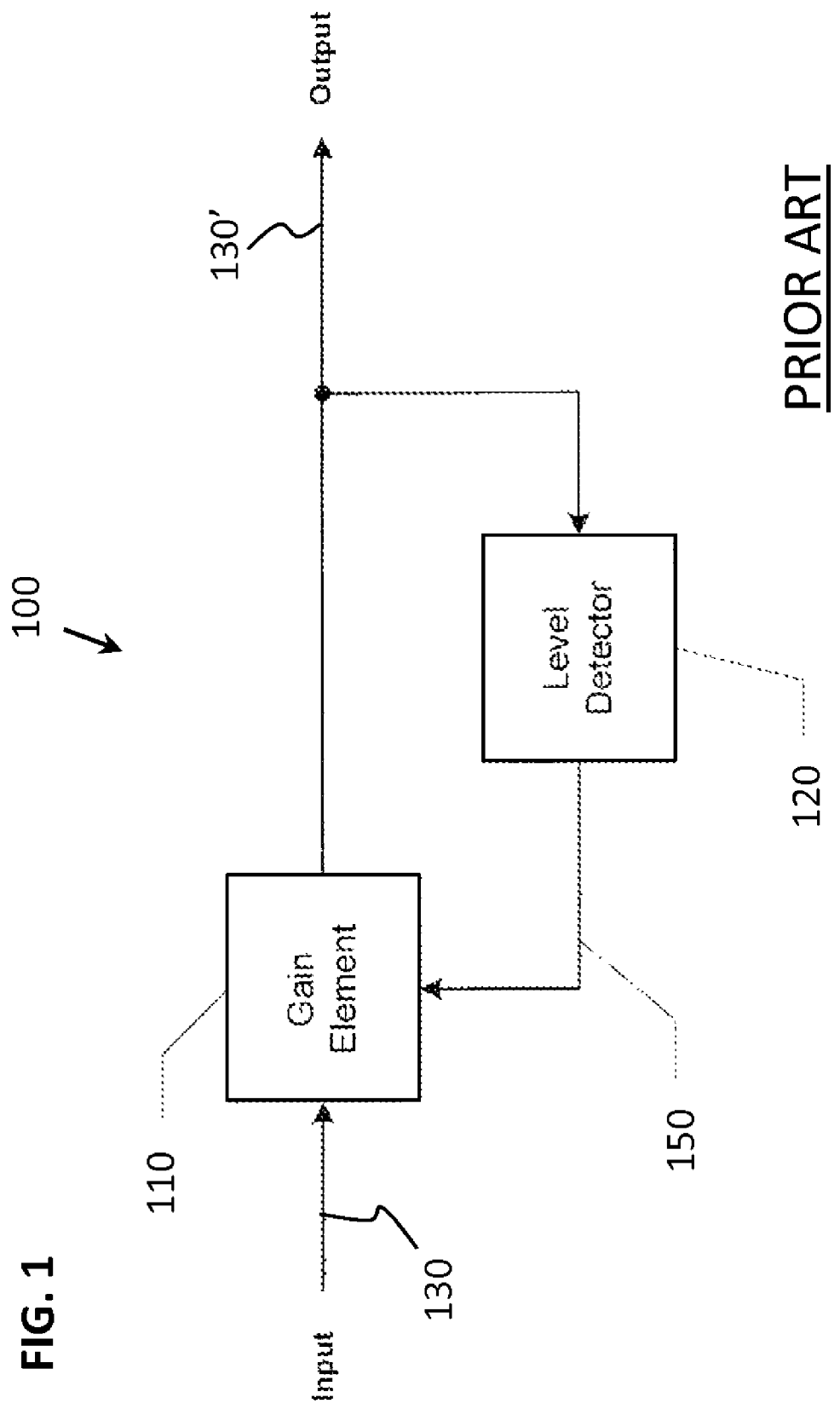
FIG. 1 illustrates an exemplary automatic gain control (AGC) system.

FIG. 1 illustrates a simplified block diagram of an automatic gain control (AGC) system 100 that includes a variable gain element 110 and a level detector 120. The variable gain element 110 receives an input signal 130, such as an audio signal, and outputs an output signal 130'. The output signal 130' is also fed to the level detector 120. The level detector 120 outputs a control signal 150 which is fed to the variable gain element 110 to lower the level of the input signal 130 if the level is higher than some upper reference, or to raise the level of the input signal 130 if the level is lower than some lower reference. This produces the output signal 130' with lowest and highest levels closer to each other than the lowest and highest levels of the input signal 130. Thus the output signal 130' has lower dynamic range than the input signal 130. The illustrated AGC system 100 is known as a feed-back AGC system because the output signal 130' is fed back to the level detector 120 to produce the control signal 150. An alternate system (not shown) where the input signal is fed to both the variable gain element and the level detector, and the control signal output by the level detector is fed forward to the variable gain element is commonly known as a feed-forward AGC. Either of these systems should be seen as systems that permanently change the audio signal.

Figure 2:
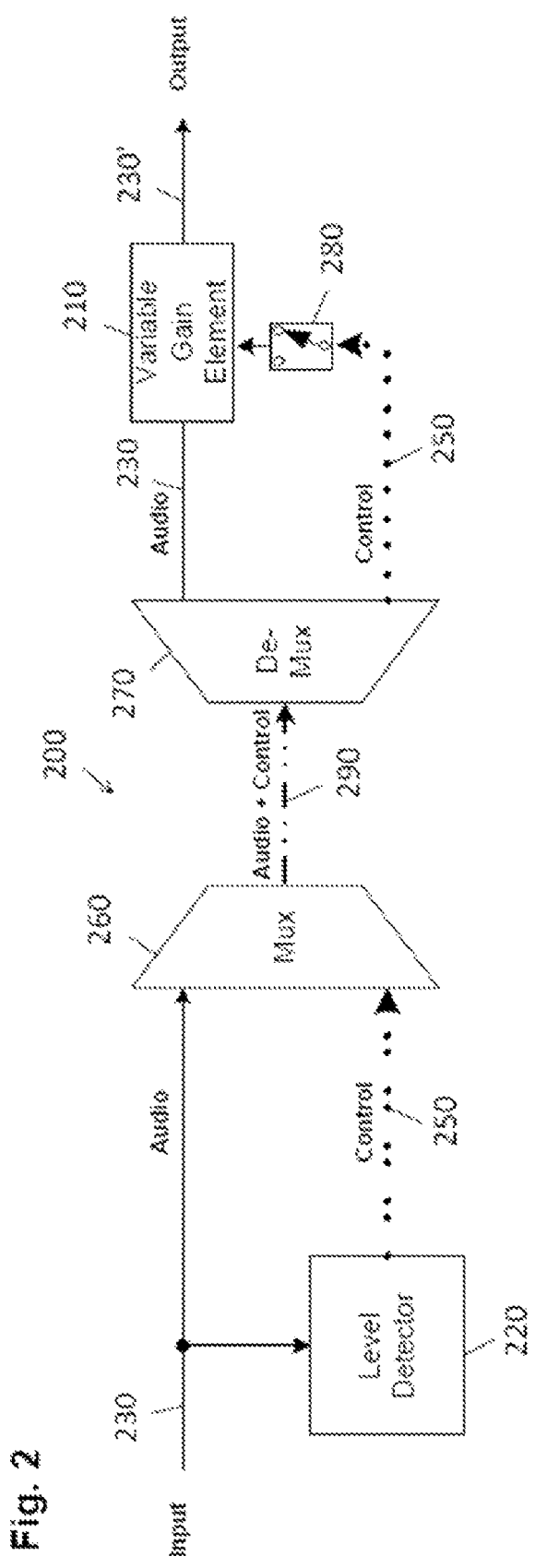
FIG. 2 illustrates an example metadata-based AGC system.

FIG. 2 illustrates a simplified block diagram of an exemplary AGC system 200. The system 200 includes a variable gain element 210, a level detector 220, a multiplexer 260, a demultiplexer 270, and a control element 280. An input signal 230 connected to the input of the system 200 is fed to the level detector 220, which outputs a control signal 250. The input signal 230 and the control signal 250 are fed to the multiplexer 260. The output of the multiplexer 260 is a composite data stream 290 that is sent to the demultiplexer 270, which demultiplexes the composite data stream 290 and outputs the input signal 230 and the control signal 250. The control signal 250 may then be used to control the variable gain element 210 to adjust the level of the input signal 230 and, as a result, control the dynamic range of the output signal 230'. In the illustrated embodiment, the control signal 250 is fed to the control element 280. The control element 280 scales or adjusts the control signal 250 from 100% to 0% to apply more or less control, respectively, to the variable gain element 210. In one embodiment, the control element 280 scales or adjusts the control signal 250 to 0% to completely ignore the control signal 250 leaving the input signal 230 unmodified, allowing the original audio to be reproduced unmodified. In other embodiments (not shown), the system 200 does not include the control element 280 and the control signal 250 is fed to the variable gain element 210.

Figure 3:
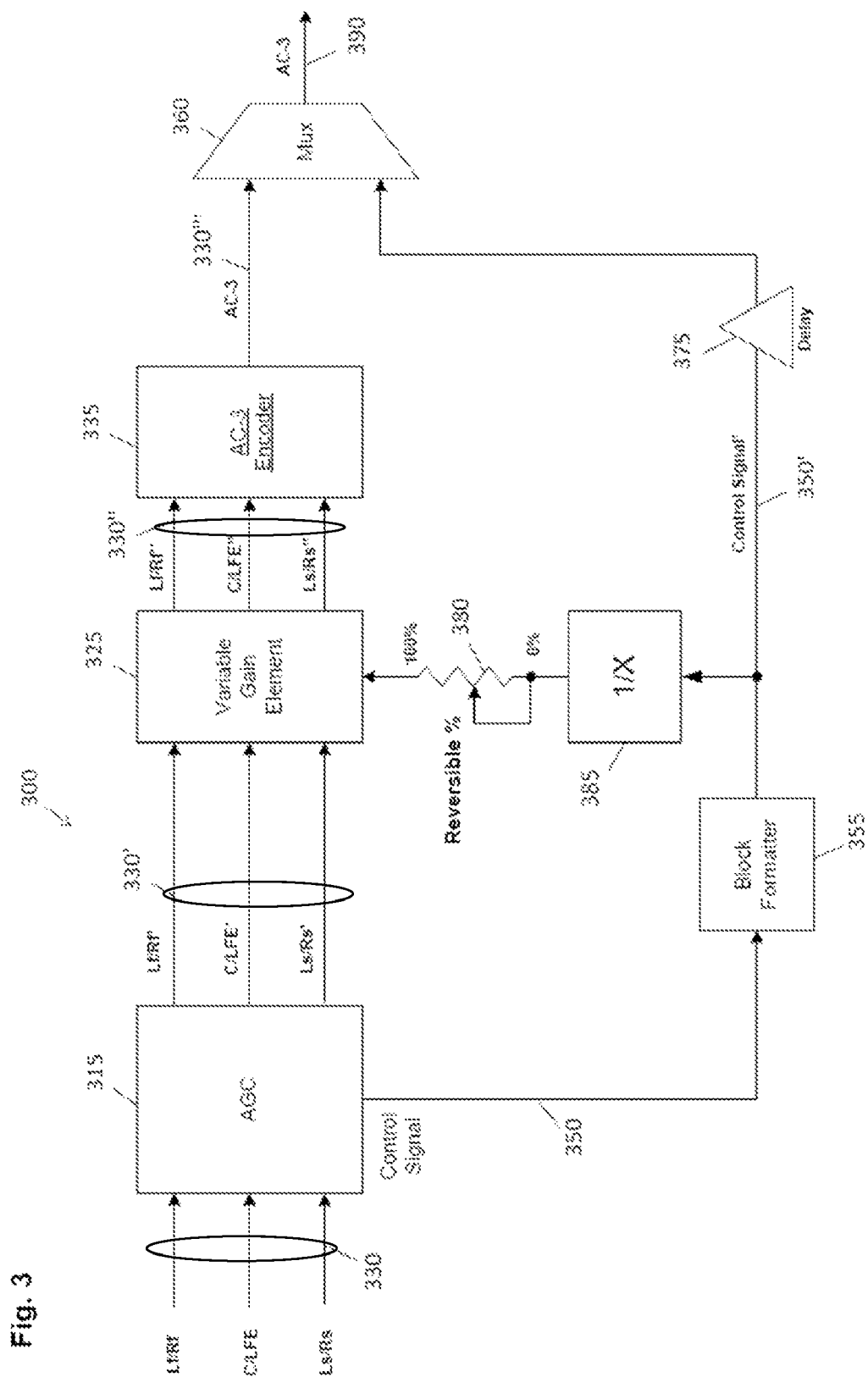
FIG. 3 illustrates a block diagram of an example system for controlling dynamic range in a hybrid permanent/reversible manner.

FIG. 3 illustrates a simplified block diagram of an exemplary system 300 for controlling dynamic range of an input signal. The system 300 includes an automatic gain control (AGC) 315, a variable gain element 325, an AC-3 encoder 335, a block formatter 355, a multiplexer 360, a delay element 375, a control element 380, and an inverting element 385. The input signal 330, which can be a single channel, stereo, or, as shown, 5.1 channels is applied to the AGC 315. The AGC 315 includes within a level detector (not shown) that detects the input signal 330 and generates a control signal 350 that is used to vary a gain element (not shown) within the AGC 315 to lower the level of the input signal 330 if the level is higher than some reference, or to raise the level of the input signal 330 if the level is lower than some reference. Therefore the AGC 315 changes the lowest and highest levels of the input signal 330 closer to each other and outputs a modified input signal 330' that has an adjusted dynamic range. The modified input signal 330' is fed to the variable gain element 325. The AGC 315 also outputs the control signal 350, which is applied to a block formatter 355 which outputs a block-based control signal 350' that includes gain control blocks (gain control values on a block basis), matching the capabilities of the final encoder. In one embodiment, the system 300 does not include the block formatter 355 or the block formatter is located somewhere else in the system 300. For example, the block formatter may be part of the AGC 315 or the variable gain element 325.

The block-based control signal 350' is then applied to the inverting element 385, which outputs an inverted control signal 350". The inverted control signal 350" is applied to the variable gain element 325. In the illustrated embodiment, the inverted control signal 350" is first fed to the control element 380. The control element 380 scales or adjusts the inverted control signal 350" from 100% to 0% to apply more or less control, respectively, to the variable gain element 325. In one embodiment, the control element 380 scales or adjusts the inverted control signal 350" to 0% to completely ignore the inverted control signal 350" leaving the modified input signal 330' modified. In other embodiments (not shown), the system 300 does not include the control element 380 and the inverted control signal 350" is fed to the variable gain element 325.

The variation of the modified input signal 330' by the variable gain element 325 based on the inverted control signal 350" can be used for the "un-application" of the control signal 350 within the accuracy of the block formatting process. Thus the modified input signal 330' may be unmodified and returned to the input signal 330 or it may be kept modified. The variable gain element 325 outputs a remainder signal 330" which has the useful property of being able to be returned to its processed state (modified input signal 330') or back to its unprocessed state (input signal 330) within the boundaries of the block processing by applying all, some, or none of the block-based control signal 350'. The remainder signal 330" is applied to the encoder 335, which outputs an encoded remainder signal 330'. The encoder 335 may be an encoder such as one described in ATSC A/52. Although the encoder 335 is disclosed as an AC-3 encoder for ease of explanation, other types of encoders may be used. The block-based control signal 350' is delayed by the delay element 375 and then multiplexed together with the encoded remainder signal 330" by the multiplexer 360 into an encoded bit stream 390 as gain control words such as compr, dynrng and/or dialnorm as described in ATSC A/52.

Figure 4:
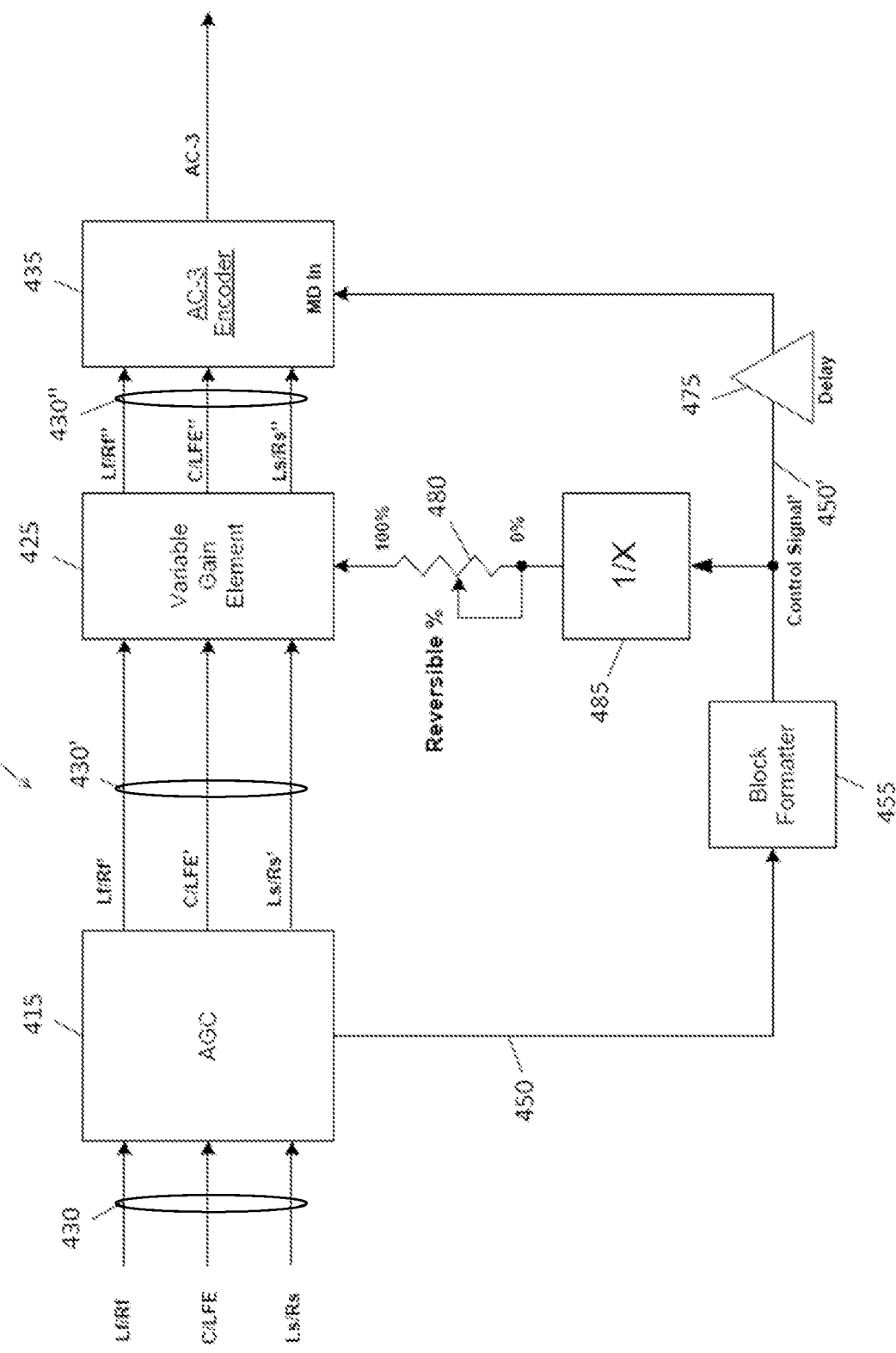
FIG. 4 illustrates a block diagram of an example system for controlling dynamic range in a hybrid permanent/reversible manner.

FIG. 4 illustrates a simplified block diagram of an exemplary system 400 for controlling dynamic range of an input signal. The system 400 includes an automatic gain control (AGC) 415, a variable gain element 425, an AC-3 encoder 435, a block formatter 455, a delay element 475, a control element 480, and an inverting element 485. The input signal 430, which can be a single channel, stereo, or, as shown, 5.1 channels is applied to the AGC 415. The AGC 415 includes within a level detector (not shown) that detects the input signal 430 and generates a control signal 450 that is used to vary a gain element (not shown) within the AGC 415 to lower the level of the input signal 430 if the level is higher than some reference, or to raise the level of the input signal 430 if the level is lower than some reference. Therefore the AGC 415 changes the lowest and highest levels of the input signal 430 closer to each other and outputs a modified input signal 430' that has an adjusted dynamic range. The modified input signal 430' is fed to the variable gain element 425. The AGC 415 also outputs the control signal 450, which is applied to a block formatter 455 which outputs a block-based control signal 450' that includes gain control blocks (gain control values on a block basis), matching the capabilities of the final encoder. In one embodiment, the system 400 does not include the block formatter 455 or the block formatter is located somewhere else in the system 400. For example, the block formatter may be part of the AGC 415 or the variable gain element 425.

The block-based control signal 450' is then applied to the inverting element 485, which outputs an inverted control signal 450". The inverted control signal 450" is applied to the variable gain element 425. In the illustrated embodiment, the inverted control signal 350" is first fed to the control element 480. The control element 480 scales or adjusts the inverted control signal 450" from 100% to 0% to apply more or less control, respectively, to the variable gain element 425. In one embodiment, the control element 480 scales or adjusts the inverted control signal 450" to 0% to completely ignore the inverted control signal 450" leaving the modified input signal 430' modified. In other embodiments (not shown), the system 400 does not include the control element 480 and the inverted control signal 450" is fed to the variable gain element 425.

The variation of the modified input signal 430' by the variable gain element 425 based on the inverted control signal 450" can be used for the "un-application" of the control signal 450 within the accuracy of the block formatting process. Thus the modified input signal 430' may be unmodified and returned to the input signal 430 or it may be kept modified. The variable gain element 425 outputs a remainder signal 430" which has the useful property of being able to be returned to its processed state (modified input signal 430') or back to its unprocessed state (input signal 430) within the boundaries of the block processing by applying all, some, or none of the block-based control signal 450'. The remainder signal 430" is applied to the encoder 435. The encoder 435 may be an encoder such as one described in ATSC A/52. Although the encoder 435 is disclosed as an AC-3 encoder for ease of explanation, other types of encoders may be used. The block-based control signal 450' is delayed by the delay element 475 and then input to the encoder 435 as metadata.

Figure 5:
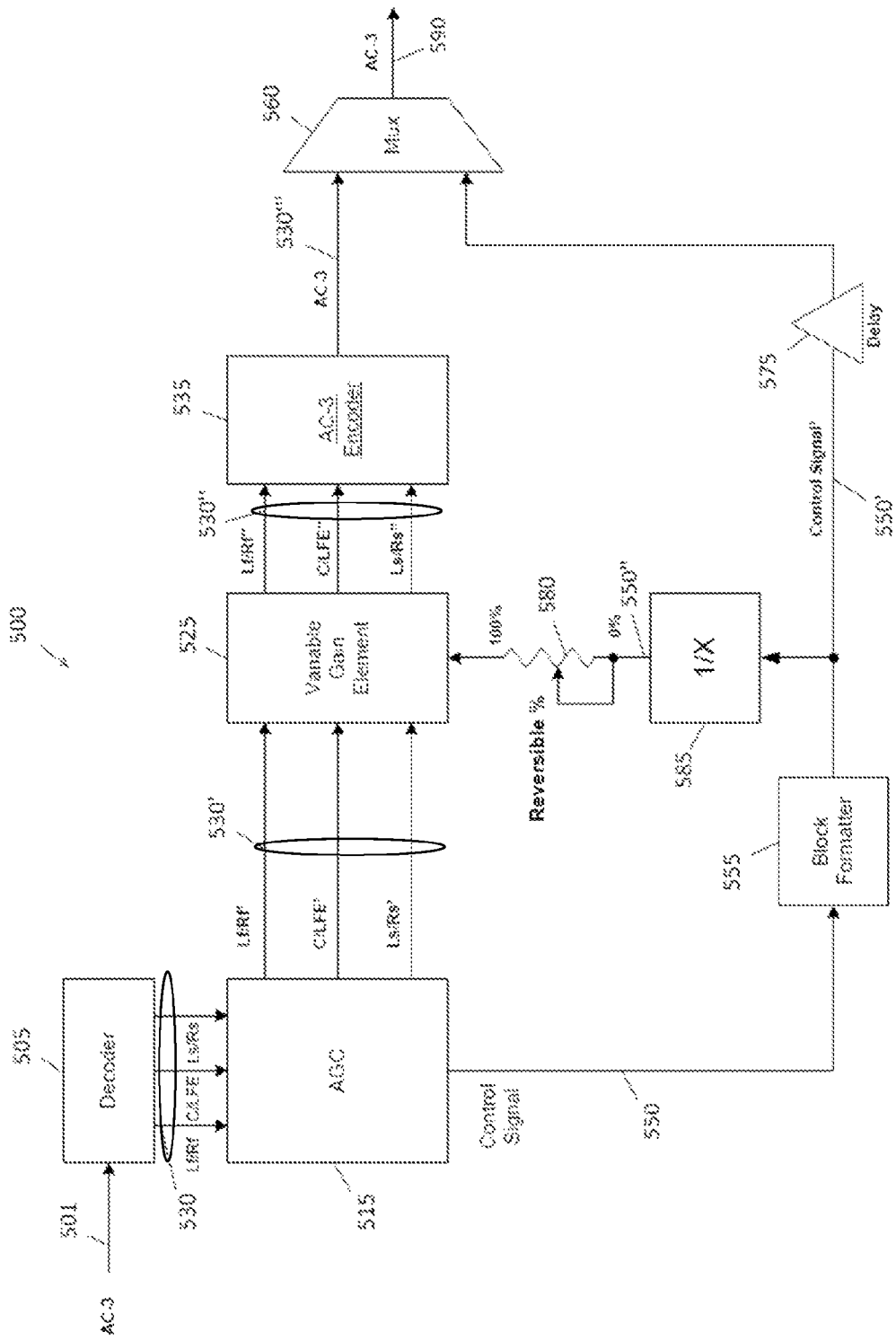
FIG. 5 illustrates a block diagram of an example system for controlling dynamic range in a hybrid permanent/reversible manner.

FIG. 5 illustrates a simplified block diagram of an exemplary system 500 for controlling dynamic range of an input signal. The system 500 includes a decoder 505, an automatic gain control (AGC) 515, a variable gain element 525, an encoder 535, a block formatter 555, a multiplexer 560, a delay element 575, a control element 580, and an inverting element 585. Input audio 501 is in the AC-3 encoded form and is first applied to the decoder 505 to produce decoded PCM audio signals, input signal 530, which can be mono, stereo or 5.1 channels as shown. The input signal 530 is applied to the AGC 515. The AGC 515 includes within it a level detector (not shown) that detects the input signal 530 and generates a control signal 550 that is used to vary a gain element (not shown) within the AGC 515 to lower the level of the input signal 530 if the level is higher than some reference, or to raise the level of the input signal 530 if the level is lower than some reference. Therefore the AGC 515 changes the lowest and highest levels of the input signal 530 closer to each other and outputs a modified input signal 530' that has an adjusted dynamic range. The modified input signal 530' is fed to the variable gain element 525. The AGC 515 also outputs the control signal 550, which is applied to a block formatter 555 which outputs a block-based control signal 550' that includes gain control blocks (gain control values on a block basis), matching the capabilities of the final encoder. In one embodiment, the system 500 does not include the block formatter 555 or the block formatter is located somewhere else in the system 500. For example, the block formatter may be part of the AGC 515 or the variable gain element 525.

The block-based control signal 550' is applied to the inverting element 585, which outputs an inverted control signal 550". The inverted control signal 550" is applied to the variable gain element 525. In the illustrated embodiment, the inverted control signal 550" is first fed to the control element 580. The control element 580 scales or adjusts the inverted control signal 550" from 100% to 0% to apply more or less control, respectively, to the variable gain element 525. In one embodiment, the control element 580 scales or adjusts the inverted control signal 550" to 0% to completely ignore the inverted control signal 550" leaving the modified input signal 530' modified. In other embodiments (not shown), the system 500 does not include the control element 580 and the inverted control signal 550" is fed to the variable gain element 525.

The variation of the modified input signal 530' by the variable gain element 525 based on the inverted control signal 550" can be used for the "un-application" of the control signal 550 within the accuracy of the block formatting process. Thus the modified input signal 530' may be unmodified and returned to the input signal 530 or it may be kept modified. The variable gain element 525 outputs a remainder signal 530" which has the useful property of being able to be returned to its processed state (modified input signal 530') or back to its unprocessed state (input signal 530) within the boundaries of the block processing by applying all, some, or none of the block-based control signal 550'. The remainder signal 530" is applied to the encoder 535, which outputs an encoded remainder signal 530'. The encoder 535 may be an encoder such as one described in ATSC A/52. Although the encoder 535 is disclosed as an AC-3 encoder for ease of explanation, other types of encoders may be used. The block-based control signal 550' is delayed by the delay element 575 and then multiplexed together with the encoded remainder signal 530" by the multiplexer 560 into an encoded bit stream 590 as gain control words such as compr, dynrng and/or dialnorm as described in ATSC A/52.

Figure 6:
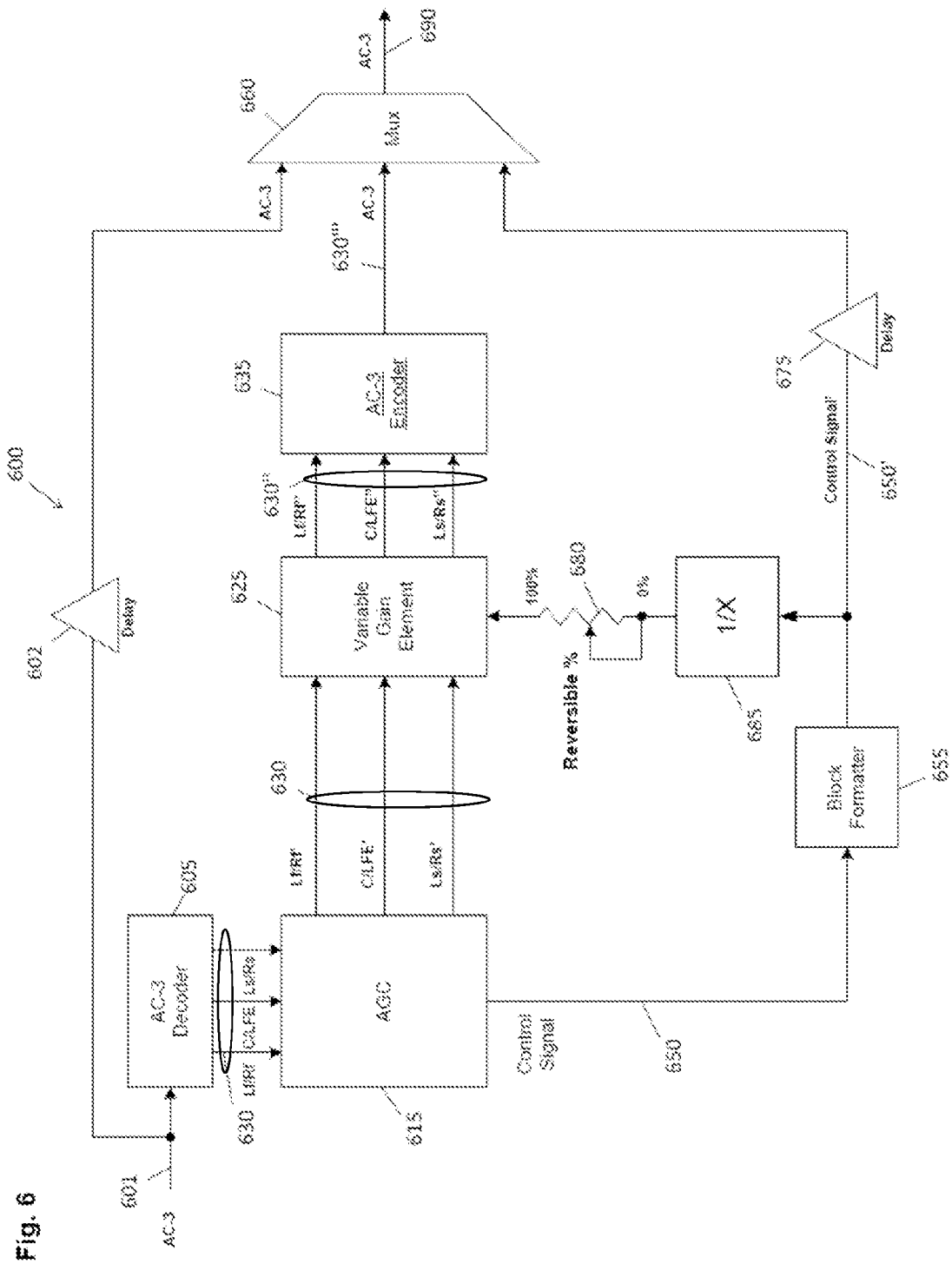
FIG. 6 illustrates a block diagram of an example system for controlling dynamic range in a hybrid permanent/reversible manner.

FIG. 6 illustrates a simplified block diagram of an exemplary system 600 for controlling dynamic range of an input signal. The system 600 includes a delay element 602, a decoder 605, an automatic gain control (AGC) 615, a variable gain element 625, an encoder 635, a block formatter 655, a multiplexer 660, a delay element 675, a control element 680, and an inverting element 685. Input signal 601 is in the AC-3 encoded form and is applied both to a delay element 602 and to the decoder 605 to produce decoded PCM audio signals, the input signal 630, which can be mono, stereo or 5.1 channels as shown. The input signal 630 is applied to the AGC 615. The AGC 615 includes within it a level detector (not shown) that detects the input signal 630 and generates a control signal 650 that is used to vary a gain element (not shown) within the AGC 615 to lower the level of the input signal 630 if the level is higher than some reference, or to raise the level of the input signal 630 if the level is lower than some reference. Therefore the AGC 615 changes the lowest and highest levels of the input signal 630 closer to each other and outputs a modified input signal 630' that has an adjusted dynamic range. The modified input signal 630' is fed to the variable gain element 625. The AGC 615 also outputs the control signal 650, which is applied to a block formatter 655 which outputs a block-based control signal 650' that includes gain control blocks (gain control values on a block basis), matching the capabilities of the final encoder. In one embodiment, the system 600 does not include the block formatter 655 or the block formatter is located somewhere else in the system 600. For example, the block formatter may be part of the AGC 615 or the variable gain element 625.

The block-based control signal 650' is applied to the inverting element 685, which outputs an inverted control signal 650". The inverted control signal 650" is applied to the variable gain element 625. In the illustrated embodiment, the inverted control signal 650" is first fed to the control element 680. The control element 680 scales or adjusts the inverted control signal 650" from 100% to 0% to apply more or less control, respectively, to the variable gain element 625. In one embodiment, the control element 680 scales or adjusts the inverted control signal 650" to 0% to completely ignore the inverted control signal 650" leaving the modified input signal 630' modified. In other embodiments (not shown), the system 600 does not include the control element 680 and the inverted control signal 650" is fed to the variable gain element 625.

The variation of the modified input signal 630' by the variable gain element 625 based on the inverted control signal 650" can be used for the "un-application" of the control signal 650 within the accuracy of the block formatting process. Thus the modified input signal 630' may be unmodified and returned to the input signal 630 or it may be kept modified. The variable gain element 625 outputs a remainder signal 630" which has the useful property of being able to be returned to its processed state (modified input signal 630') or back to its unprocessed state (input signal 630) within the boundaries of the block processing by applying all, some, or none of the block-based control signal 650'. The remainder signal 630" is applied to the encoder 635, which outputs an encoded remainder signal 630'. The encoder 635 may be an encoder such as one described in ATSC A/52. Although the encoder 635 is disclosed as an AC-3 encoder for ease of explanation, other types of encoders may be used. The block-based control signal 650' is delayed by the delay element 675 and then multiplexed together with the delayed input signal 601 and the encoded remainder signal 630" by the multiplexer 660 into an encoded bit stream 690 as gain control words such as compr, dynrng and/or dialnorm as described in ATSC A/52. It is then possible to compare and modify the original encoded audio data blocks to more closely match the newly encoded data blocks to allow for a more accurate representation of the remainder audio, essentially allowing audio modification without fully decoding and re-encoding.

Figure 7:
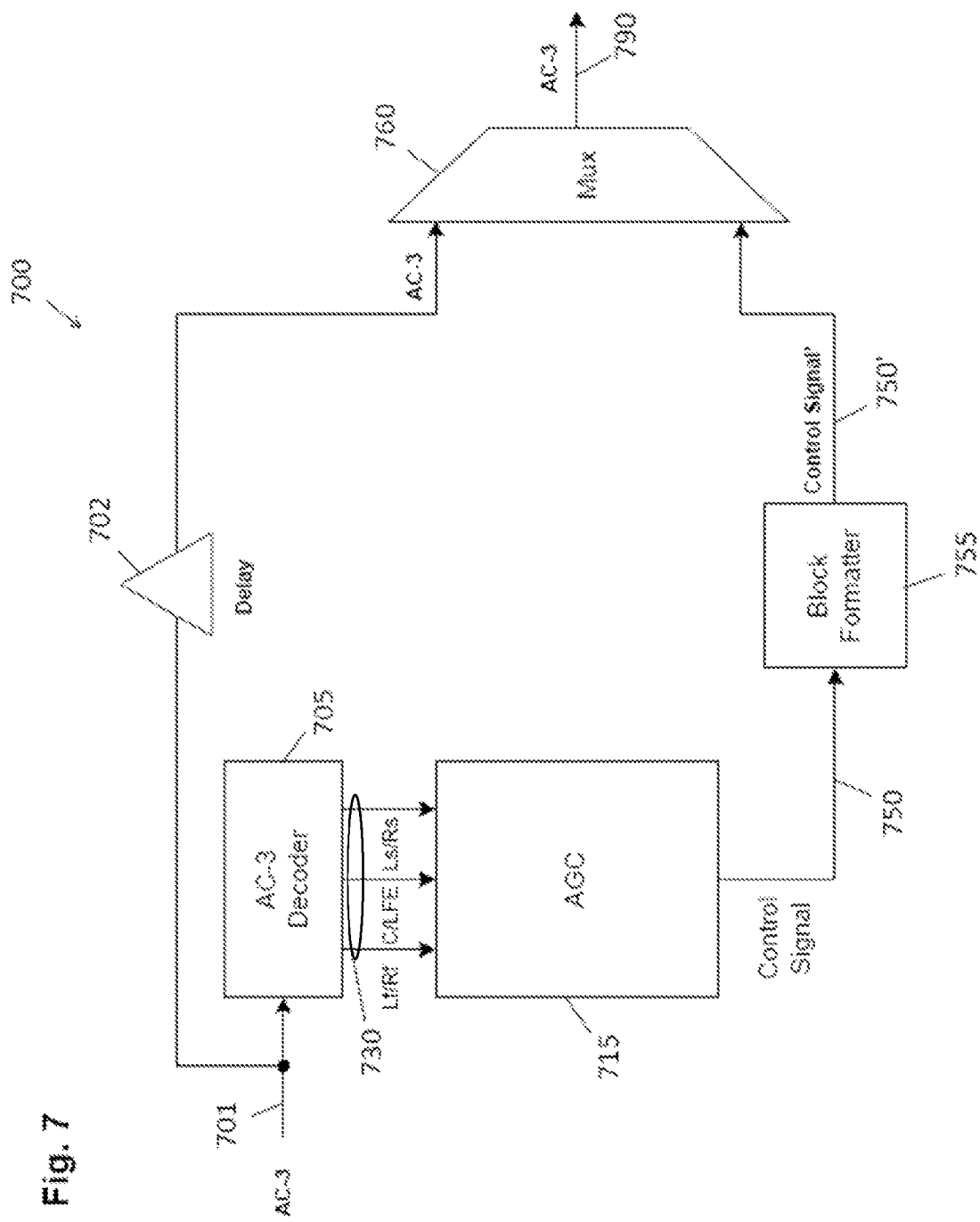
FIG. 7 illustrates a block diagram of an example system for controlling dynamic range in a hybrid permanent/reversible manner.

FIG. 7 illustrates a simplified block diagram of an exemplary system 700 for controlling dynamic range of an input signal. The system 700 includes a delay element 702, a decoder 705, an automatic gain control (AGC) 715, a block formatter 755, a multiplexer 760. Input signal 701 is in the AC-3 encoded form and is applied both to the delay element 702 and to the decoder 705 to produce decoded PCM audio signals, the input signal 730, which can be mono, stereo or 5.1 channels as shown. The input signal 730 is applied to the AGC 715, which includes within it a level detector (not shown) that detects the input signal 730 and generates a control signal 750 that may be used (not shown) to lower the level of the input signal 730 if the level is higher than some reference, or to raise the level of the input signal 730 if the level is lower than some reference. The AGC 715 outputs the control signal 750, which is applied to a block formatter 755 which outputs a block-based control signal 750' that includes gain control blocks (gain control values on a block basis), matching the capabilities of the final encoder. In one embodiment, the system 700 does not include the block formatter 755 or the block formatter is located somewhere else in the system 700. For example, the block formatter may be part of the AGC 715.

The block-based control signal 750' is multiplexed together with the delayed input signal 701 by the multiplexer 760 into an encoded bit stream 790 as gain control words such as compr, dynrng and/or dialnorm as described in ATSC A/52. It is then possible for insertion of gain control information into a previously encoded bit stream without the need to decode and re-encode the signal.

It should be noted that the embodiments described here can work alone or in tandem with additional audio processing, and can operate in the baseband PCM or compressed domains such as AC-3, DTS, MPEG, and others via standard gain adjustments or metadata manipulation.

It should be noted that the processes described here can operate in real-time, faster than real-time in a software or hardware or hybrid software/hardware implementation, or slower than real time in a software or hardware or hybrid software/hardware implementation.

It should be noted that unlike prior art, implementation of some of the systems and methods disclosed herein allow for control of dynamic range in a reversible manner, in a permanent manner, or anywhere in between reversible and permanent. In one embodiment, where implementation of some of the systems and methods disclosed herein allow for control of dynamic range in the reversible manner, adjustments made to the audio are done via control data sent alongside the original audio in the form of metadata which can be applied fully, in a scaled manner, or not at all but where the original audio is delivered separately and intact. In another embodiment, where implementation of some of the systems and methods disclosed herein allow for control of dynamic range in the permanent manner, the audio is fully processed before encoding and control data sent alongside the original audio is fixed at a constant value such that there will be no difference between applying it fully or not applying it at all. In yet another embodiment, where implementation of some of the systems and methods disclosed herein allow for control of dynamic range in the hybrid case, part of the adjustment of the audio is done in a permanent manner, while the remaining part is done in a reversible manner allowing partial reversibility.

FIG. 8 illustrates a block diagram of an exemplary AGC system 800 that may be used as the AGC of the systems for controlling dynamic range of an input signal as described above. The system 800 includes a wideband AGC 811, crossovers 813a-d, band-specific AGC 814a-d, band-specific limiters 816a-d, a summer 817, an overall peak limiter 818, and an overall summer 850. The input signal 830 is first adjusted in average level by the wideband AGC 811. The adjusted input signal 812 is then split into a multiplicity of bands by the crossovers 813a-d, shown here as five bands but can be any number of bands. Each band has its own AGC 814a-d specifically optimized for the range of frequencies it is controlling (e.g., HF=high frequency, UMF=upper mid frequency, LMF=lower mid frequency, ULF=upper low frequency, LLF=lower low frequency). Each band of frequencies is applied to a corresponding limiter 816a-d and then the bands are summed by the summer 817 and applied to the overall peak limiter 818. Each of the wideband AGC 811, AGC 814a-d, limiters 816a-d, and overall peak limiter 818 output corresponding control signals, all of which are summed by the summer 819 into a final composite control signal 850.

While example systems, methods, and so on, have been illustrated by describing examples, and while the examples have been described in considerable detail, it is not the intention of the applicants to restrict or in any way limit scope to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A system for controlling dynamic range of an audio signal, the system comprising:
    an automatic gain control element configured to receive an input signal having a varying level and to output:
        a control signal that varies based on the varying level of the input signal, and
        a modified input signal having a dynamic range different than a dynamic range of the input signal;
    an inverter in circuit with the automatic gain control element and configured to receive and invert at least one of:
        the control signal, or
        a block-based control signal corresponding to the control signal in block format; and
    a variable gain element configured to receive the modified input signal and at least some of the inverted at least one of the control signal or the block-based control signal, and further configured to output a remainder signal corresponding to the modified input signal as unmodified based on the at least some of the inverted at least one of the control signal or the block-based control signal.

2. The system of claim 1, comprising:
    a block formatter in circuit with the automatic gain control element and the inverter, and configured to receive the control signal and to output the block-based control signal corresponding to the control signal in block format.

3. The system of claim 1, comprising:
    a control element in circuit with the inverter and the variable gain element, and configured to scale the inverted at least one of the control signal or the block-based control signal to affect the unmodifying of the modified input signal by the variable gain element to produce the remainder signal.

4. The system of claim 1, comprising:
    a delay element configured to introduce delay to the at least one of the control signal or the block-based control signal to output a metadata signal; and
    an encoder configured to receive the remainder signal and the metadata signal, and further configured to output an encoded remainder signal encoding the remainder signal and the metadata signal.

5. The system of claim 1, comprising:
    a delay element configured to introduce delay to the at least one of the control signal or the block-based control signal to output a delayed control signal;
    an encoder configured to receive the remainder signal and to output an encoded remainder signal; and
    a multiplexer configured to receive the delayed control signal and the encoded remainder signal, and further configured to output an encoded bit stream including the encoded remainder signal and the delayed control signal.

6. The system of claim 1, comprising:
    a block formatter in circuit with the automatic gain control element and the inverter, and configured to receive the control signal and to output the block-based control signal corresponding to the control signal in block format;
    a control element in circuit with the inverter and the variable gain element, and configured to scale the inverted block-based control signal to affect the unmodifying of the modified input signal by the variable gain element to produce the remainder signal;
    a delay element configured to introduce delay to the block-based control signal to output a metadata signal; and
    an encoder configured to receive the remainder signal and the metadata signal, and further configured to output an encoded remainder signal encoding the remainder signal and the metadata signal.

7. The system of claim 1, comprising:
    a block formatter in circuit with the automatic gain control element and the inverter, and configured to receive the control signal and to output the block-based control signal corresponding to the control signal in block format;
    a control element in circuit with the inverter and the variable gain element, and configured to scale the inverted block-based control signal to affect the unmodifying of the modified input signal by the variable gain element to produce the remainder signal;
    a delay element configured to introduce delay to the block-based control signal to output a delayed control signal;
    an encoder configured to receive the remainder signal and to output an encoded remainder signal; and
    a multiplexer configured to receive the delayed control signal and the encoded remainder signal, and further configured to output an encoded bit stream including the encoded remainder signal and the delayed control signal.

8. The system of claim 7, comprising:
    a decoder configured to receive an encoded input signal and to decode the encoded input signal into the input signal.

9. The system of claim 8, comprising:
    a second delay element configured to receive the encoded input signal, to introduce delay to the encoded input signal, and to output a delayed encoded input signal,
    wherein the multiplexer is configured to receive the delayed control signal, the encoded remainder signal and the delayed encoded input signal, and further configured to output an encoded bit stream including the delayed control signal, the encoded remainder signal and the delayed encoded input signal.

10. The system of claim 1, wherein the automatic gain control element comprises:

a wideband automatic gain control (WBAGC) element configured to receive the input signal and to output an averaged level adjusted input signal and a WBAGC control signal;
a plurality of crossovers, each crossover associated with a respective frequency band and configured to receive the averaged level adjusted input signal, the plurality of crossovers configured to split the averaged level adjusted input signal into respective frequency band specific input signals;
a plurality of frequency band specific automatic gain control (FBSAGC) elements, each FBSAGC element associated with a respective frequency band, the plurality of FBSAGC elements configured to receive the frequency band specific input signals and to output respective dynamic range modified frequency band specific input signals and an FBSAGC control signal;
a plurality of frequency band specific limiters (FBSL), each FBSL associated with a respective frequency band, the plurality of FBSL configured to receive the dynamic range modified frequency band specific input signals and to output respective limited dynamic range modified frequency band specific input signals and an FBSL control signal;
a first summer configured to receive the limited dynamic range modified frequency band specific input signals and to output a summed signal;
a final limiter configured to receive the summed signal and to output the modified input signal and a final limiter control signal; and
a second summer configured to receive the WBAGC control signal, the FBSAGC control signal, the FBSL control signal and the final limiter control signal and to output the control signal.

11. A method for controlling dynamic range of an audio signal, the method comprising:
receiving an input signal having a varying level;
modifying the input signal to output:
a modified input signal having a dynamic range different than a dynamic range of the input signal, and
a control signal that varies based on the varying level of the input signal;
inverting at least one of:
the control signal, or
a block-based control signal corresponding to the control signal in block format;
unmodifying the modified input signal based on at least some of the inverted at least one of the control signal or the block-based control signal; and
outputting a remainder signal corresponding to the modified input signal as unmodified.

12. The method of claim 1, comprising:
block formatting the control signal to output the block-based control signal corresponding to the control signal in block format.

13. The method of claim 1, comprising:
scaling the inverted at least one of the control signal or the block-based control signal to affect the unmodifying of the modified input signal.

14. The method of claim 1, comprising:
delaying the at least one of the control signal or the block-based control signal;
outputting a metadata signal corresponding to the delayed at least one of the control signal or the block-based control signal; and
encoding the remainder signal and the metadata signal.

15. The method of claim 1, comprising:
delaying the at least one of the control signal or the block-based control;
encoding the remainder signal; and
multiplexing the delayed at least one of the control signal or the block-based control and the encoded remainder signal.

16. The method of claim 1, comprising:
block formatting the control signal to output the block-based control signal corresponding to the control signal in block format;
scaling the inverted block-based control signal to affect the unmodifying of the modified input signal;
delaying the block-based control signal to output a metadata signal; and
encoding the remainder signal and the metadata signal.

17. The method of claim 1, comprising:
block formatting the control signal to output the block-based control signal corresponding to the control signal in block format;
scaling the inverted block-based control signal to affect the unmodifying of the modified input signal;
delaying the block-based control signal to output a delayed control signal;
encoding the remainder signal to output an encoded remainder signal; and
multiplexing the delayed control signal and the encoded remainder signal.

18. The method of claim 17, comprising:
decoding an encoded input signal into the input signal.

19. The system of claim 18, comprising:
delaying the encoded input signal to output a delayed encoded input signal,
wherein the multiplexing includes multiplexing the delayed control signal, the encoded remainder signal and the delayed encoded input signal.

20. The method of claim 1, wherein the modifying the input signal comprises:
average level detecting the input signal to output a wide band adjusted control signal;
modifying the input signal into an averaged level adjusted input signal based on the wide band adjusted control signal;
splitting the averaged level adjusted input signal into frequency band specific input signals;
level detecting the frequency band specific input signals to output a respective frequency band specific control signal;
modifying each of the frequency band specific input signals into dynamic range modified frequency band specific input signals based on the respective frequency band specific control signal;
limiting the dynamic range modified frequency band specific input signals to output respective limited dynamic range modified frequency band specific input signals and a frequency band specific limited control signal;
summing the limited dynamic range modified frequency band specific input signals to output a summed signal;
limiting the summed signal to output the modified input signal and a final limiter control signal; and
summing the wide band adjusted control signal, the frequency band specific control signal, the frequency band specific limited control signal and the final limiter control signal to output the control signal.

* * * * *